US012683602B2

(12) United States Patent (10) Patent No.: US 12,683,602 B2
Mangtani et al. (45) Date of Patent: Jul. 14, 2026

(54) POWER-THRU BOOSTER

(71) Applicant: Allegro MicroSystems, LLC, Manchester, NH (US)

(72) Inventors: Vijay Mangtani, Nashua, NH (US); Maurizio Salato, Bedford, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 18/813,518

(22) Filed: Aug. 23, 2024

(65) Prior Publication Data

US 2026/0058654 A1 Feb. 26, 2026

(51) Int. Cl.
H03K 17/687 (2006.01)

(52) U.S. Cl.
CPC .................................. H03K 17/6871 (2013.01)

(58) Field of Classification Search
CPC .................................................... H03K 17/6871
See application file for complete search history.

(56) References Cited

U.S. PATENT DOCUMENTS

| | | |
|---|---|---|
| 7,649,325 B2 | 1/2010 | McIntosh et al. |
| 9,294,084 B1 | 3/2016 | McIntosh et al. |
| 9,425,785 B1 | 8/2016 | Wibben |
| 9,537,383 B1 | 1/2017 | Wibben |
| 10,715,034 B2 | 7/2020 | Harrison |
| 11,082,038 B1 | 8/2021 | Ross et al. |
| 11,201,619 B2 | 12/2021 | Rinne et al. |

| | | |
|---|---|---|
| 11,211,929 B2 | 12/2021 | Rinne et al. |
| 11,764,778 B2 | 9/2023 | Rinne et al. |
| 11,770,072 B2 | 9/2023 | Suraci et al. |
| (Continued) | | |

FOREIGN PATENT DOCUMENTS

| | | |
|---|---|---|
| CN | 111615789 A | 9/2020 |
| EP | 2 011 219 B1 | 7/2017 |
| (Continued) | | |

OTHER PUBLICATIONS

U.S. Appl. No. 18/471,443, filed Sep. 21, 2023, Salato et al.
(Continued)

*Primary Examiner* — Menatoallah Youssef
*Assistant Examiner* — Colleen J O Toole
(74) *Attorney, Agent, or Firm* — DALY, CROWLEY, MOFFORD & DURKEE, LLP

(57) ABSTRACT

A drive circuit comprises a transformer, a primary side circuit communicating with a primary winding of the transformer, and a secondary side circuit communicating with a secondary winding of the transformer. The primary side circuit couples to a primary side supply voltage and to an input signal and couples a first signal to the primary winding. The secondary side circuit communicates with the semiconductor switch and provides, responsive to the first signal, a second signal to control the semiconductor switch, comprising at least one of a primary bias and a secondary bias. For a first gate charge level range, the secondary side circuit provides the primary bias. For a second gate charge level range greater than the first range, the secondary side circuit is controlled by a secondary bias circuit comprising a storage capacitor configured to accumulate voltage when the secondary side circuit is providing the primary bias.

20 Claims, 7 Drawing Sheets

(56)                    References Cited

U.S. PATENT DOCUMENTS

| | | | | |
|---|---|---|---|---|
| 2016/0142049 A1* | 5/2016 | Richardson | .......... | H03K 17/687 |
| | | | | 327/109 |
| 2020/0099376 A1 | 3/2020 | Rinne et al. | | |
| 2021/0376822 A1 | 12/2021 | Thompson et al. | | |
| 2022/0020843 A1 | 1/2022 | Grasso | | |
| 2023/0353145 A1 | 11/2023 | Rinne et al. | | |

FOREIGN PATENT DOCUMENTS

| | | |
|---|---|---|
| EP | 3 216 125 B1 | 11/2022 |
| JP | 5054759 B2 | 10/2012 |

OTHER PUBLICATIONS

U.S. Notice of Allowance dated Sep. 24, 2024 for U.S. Appl. No. 18/351,760; 7 Pages.
Allegro MicroSystems, LLC, "Self-Powered Single-Channel Isolated GaN FET Driver with Power-Thru Integrated Isolated Bias Supply;" AHV85110 Data Sheet; Jun. 20, 2023; 22 Pages.
Allegro MicroSystems, LLC, "Self-Powered Single-Channel Isolated GaN FET Driver with Regulated Bipolar Output Drive;" AHV85111 Data Sheet; Sep. 13, 2023; 20 Pages.
Allegro MicroSystems, LLC, "Power Up Your Performance;" AHV8511X; Poster Retrieved Dec. 29, 2023; 3 Pages.
Allegro MicroSystems, LLC, "Power-Thru Technology;" Retrieved from www.allegromicro.com on Oct. 18, 2023; 3 Pages.
Allegro MicroSystems, LLC, "Simplify Power Module Design with Power-Thru Technology;" Retrieved from www.allegromicro.com; Nov. 22, 2022; 2 Pages.
Allegro MicroSystems, LLC, "The Power of Simplicty;" AM053 Data Sheet; Jul. 2023; 2 Pages.

Dobbyn, "FET Gate Drive and Bipolar Output Applicable to AHV85110KNHTR Gate Drivers;" AN296268; Application Information; Released Aug. 30, 2022; 6 Pages.
Dobbyn, "Minimizing PCB Parasitic Effects with Optimum Layout of the Gate Driver Loop Applicable to AHV85110 and AHV85111 Gate Drivers;" AN296269; Application Information; Released Aug. 30, 2022; 4 Pages.
Lu, "Seven Steps to Highly Effective GaN Designs;" Bodo's Power Systems; Dec. 2021; 2 Pages.
Murray, "Design of Area-Efficient Integrated Gate Drivers;" Paper Submitted in Partial Fulfillment of the Requirements for the Degree of Master of Engineering in Electrical Engineering and Computer Science at the Massachusetts Institute of Technology; Jun. 2021; 98 Pages.
Sanchez, "GaN Driver Schematic and Layout Recommendations;" Application Brief from Texas Instruments; Aug. 2022; 5 Pages.
Sapre, "Isolated Gate Drivers—What, Why, and How?;" Article from Analog Dialogue 52-06 at Analog Devices; Jun. 2018; 4 Pages.
Singh, "Design and Application Guide for AHV85110;" AN296287 Design and Application Guide from Allegro MicroSystems, LLC; Application Information; Released Jun. 21, 2023; 13 Pages.
Singh, "AHV85111 Design and Application Guide;" AN296290; Allegro MicroSystems, LLC; Application Information; Released Sep. 25, 2023; 15 Pages.
Wang, "Solving the Challenges of Increasing Power Density by Reducing No. of Power Rails;" Article from www.allegromicro.com; Mar. 28, 2023; 4 Pages.
Seidel et al., "Isolated 100% PWM Gate Driver with Auxiliary Energy and Bidirectional FM/AM Signal Transmission via Single Transformer;" 2015 IEEE Applied Power Electronics Conference and Exposition (APEC); Mar. 15, 2015; 4 Pages.
Extended European Search Report (EESR) dated Jan. 2, 2026 for European Application No. 25196799.8; 9 Pages.

* cited by examiner

POWER-THRU BOOSTER

FIELD

Embodiments of the disclosure generally relate to devices, systems, and methods for providing electronic circuits such as gate drive circuits and switch drive circuits. More particularly, the disclosure describes embodiments relating to devices, systems, and methods to increase gate charge handling capacity of switch drivers in higher power applications.

BACKGROUND

In the field of power electronics, drive circuits, commonly referred to as drivers, are used to turn switches (e.g., semiconductor switches) on and off. Such switches can be part of a power train where they are used to switch energy through a circuit, for example, in a power conversion system. An exemplary electronic power conversion system may include a first control interface and a second control interface that are coupled to each other via a magnetic coupling device, such as a transformer. The magnetic coupling device may be used to transfer power for powering a load that is controlled jointly by the first control interface and the second control interface. The magnetic coupling device also may be used to transfer control signals. The load may include an electric motor and/or any other suitable type of electric load. The first control interface and the second control interface may control various aspects of the operation of the load and be in communication with each other. An isolated gate driver architecture for a power electronics system can make use of this architecture, wherein such an architecture is configured to deliver power from a primary side of the magnetic coupling device to a secondary side of the magnetic coupling device. For example, in some applications the isolated gate driver is configured as part of a power train that turns switches on and off.

In a power conversion system, when a switch is on (a period referred to as the "on time" for a switch), current is transferred through the switch to the components of the system. When the switch is off (a period referred to as "off time") no current is passed. The switch or switches can be coupled with other components (including but not limited to inductors, capacitors, and/or transformers) to make up the power conversion system. Examples of usable switches include, but are not limited to, field effect transistors (FETs), metal oxide semiconductor field effect transistors (MOS-FETs), bipolar junction transistors (BJTs), insulated gate bipolar transistors (IGBTs), Gallium Nitride switches (including but not limited to GaN FETs), and Silicon Carbide (SiC) switches, including but not limited to SiC FETs.

Regardless of the type of switch employed, a drive signal is required to turn the switch on or off. It will be appreciated by those skilled in the art that different types of switches have different drive signal requirements. Thus, for example MOSFETs may be considered to present a capacitive load, BJTS present a PN junction type load. Accordingly drive circuits may be configured to work with the type of load presented by the switch, and various constraints may be considered when it comes to designing or selecting a drive circuit.

SUMMARY

The following presents a simplified summary to provide a basic understanding of one or more aspects of the embodiments described herein. This summary is not an extensive overview of all of the possible embodiments and is neither intended to identify key or critical elements of the embodiments, nor to delineate the scope thereof. Rather, the primary purpose of the summary is to present some concepts of the embodiments described herein in a simplified form as a prelude to the more detailed description that is presented later.

Drive circuits advantageously are capable of providing a sufficient drive current and voltage to turn on and off a switch that they are driving, but it can be challenging to provide an economical and efficient drive circuit that it usable for multiple types of switches having varying current and/or voltage requirements. Because the cost of manufacturing drive circuits increases along with their power consumption as drive currents and voltages increase, it can be costly and inefficient to provide a drive circuit that provides more current or voltage than is needed for a given switch. Thus, some types of driver circuits, such as isolated gate drivers, are designed for more limited applications. It would be advantageous to address these and other issues via an arrangement that can flexibly allow external boot-strap supply with the power-thru architecture, on an as needed basis, to help increase the gate charge handling capability in higher power applications.

At least some embodiments herein help to address at least some of these challenges.

In one aspect, a drive circuit for controlling an operation of a semiconductor switch is provided, comprising a transformer, a primary side circuit, and a secondary side circuit. The transformer has a primary winding and a secondary winding. The primary side circuit is in operable communication with the primary winding and is operably coupled to a primary side supply voltage and to an input signal, wherein the primary side circuit is configured to operably couple a first signal to the primary winding of the transformer. The secondary side circuit is in operable communication with the secondary winding and the semiconductor switch and is configured to provide, in response to the first signal coupled from the primary winding to the secondary winding, a second signal to control the semiconductor switch. The second signal comprises at least one of a primary bias and a secondary bias, wherein: for a first range of gate charge levels required by the semiconductor switch, the secondary side circuit provides the primary bias; and for a second range of gate charge levels required by the semiconductor switch, where the second range of gate charge levels includes gate charge levels that are greater than those in the first range of gate charge levels, the secondary side circuit is configured to be controllable by a secondary bias circuit that is operably and removably coupled to the drive circuit, wherein the secondary bias circuit comprises a storage capacitor that is configured to accumulate voltage when the secondary side circuit is providing the primary bias.

In some embodiments, the secondary side circuit comprises a rectifier in operable communication with the secondary winding and a bias low dropout circuit in operable communication with the rectifier, wherein the secondary side circuit further comprises a boost tap point disposed in between the rectifier and the bias low dropout circuit, wherein the storage capacitor of the secondary bias circuit is operably coupled at a first side to the boost tap point and at a second side to an isolated output return for the secondary side circuit. In some embodiments, the secondary side circuit comprises a rectifier in operable communication with the secondary winding and a bias low dropout circuit in operable communication with the rectifier, wherein the secondary side circuit further comprises a boost tap point disposed in between the rectifier and the bias low dropout circuit, wherein the storage capacitor of the secondary bias circuit is operably coupled at a first side to the boost tap point and at a second side to an isolated output return for the secondary side circuit. In some embodiments, when the semiconductor switch is turned on, the semiconductor switch is supplied with gate charge via a voltage stored on the storage capacitor, and when the semiconductor switch is turned off, the diode of the secondary side circuit is config- ured to replenish the voltage stored on the storage capacitor.

In some embodiments, the secondary side circuit is con- figured to provide the second signal when the semiconductor switch is closed. In some embodiments, wherein the second signal comprises a combined bias that comprises a logically OR'd combination of the primary bias and the secondary bias. In some embodiments, when the semiconductor switch is turned on, the semiconductor switch is supplied with gate charge via a voltage stored on the storage capacitor, and when the semiconductor switch is turned off, the secondary side circuit is configured to replenish the voltage stored on the storage capacitor.

In another aspect, an isolated high side drive circuit for controlling an operation of a semiconductor switch is pro- vided, comprising a transformer, a primary side circuit, and a secondary side circuit. The transformer has a primary winding and a secondary winding. The primary side circuit is in operable communication with the primary winding and is operably coupled to a primary side supply voltage and to an input signal, wherein the primary side circuit derives switch instructions for controlling the operation of the semiconductor switch based on a state of the input signal and provides the switch instructions as part of a first signal operably coupled to the primary winding of the transformer. The secondary side circuit is in operable communication with the secondary winding and the semiconductor switch and is configured to provide, in response to the first signal coupled from the primary winding to the secondary winding, a second signal to control the semiconductor switch, wherein the second signal comprises at least one of a primary bias and a secondary bias. For a first range of gate charge required by the semiconductor switch, the secondary side circuit provides the primary bias, wherein the primary bias is provided using components that are part of the secondary side circuit. For a second range of gate charge required by the semiconductor switch, where the second range of gate charge covers a range that is larger than the first range of gate charge, the secondary side circuit is configured to provide the secondary bias via connection to an external bootstrap circuit in operable communication with the secondary side circuit.

In some embodiments, the secondary side circuit is con- figured to provide the second signal when the semiconductor switch is closed. In some embodiments, the second signal comprises a combined bias that comprises a logically OR'd combination of the primary bias and the secondary bias. In some embodiments, the secondary side circuit comprises a rectifier having an input operably coupled to the secondary winding of the transformer and an output operably coupled to an input of a DC voltage regulator, the DC voltage regulator configured to provide a gate drive rail for use by the semiconductor switch.

In some embodiments, the external bootstrap circuit com- prises a capacitor having a first plate and a second plate and a diode having a cathode terminal and an anode terminal, wherein: the secondary side circuit comprises a source connection configured for connection to a source terminal of the semiconductor switch and a tap point connection oper- ably coupled to the input of the DC voltage regulator; the first plate of the capacitor is configured for operable con- nection to a source terminal of the semiconductor switch and the second plate is operably connected to the cathode terminal of the diode and to the tap point connection; the anode terminal of the diode is operably connected to an isolated supply voltage that is electrically isolated from the primary side supply voltage, and the cathode terminal is operably connected to the second plate of the capacitor and the tap point connection; and wherein, when the external bootstrap circuit is connected to the secondary side circuit, a signal provided to the input of the DC voltage regulator comprises a logical OR'ing together of the output of the rectifier and of a signal at the cathode terminal of the diode.

In some embodiments, when the semiconductor switch is turned on, it is supplied with gate charge via voltage stored on the capacitor of the external bootstrap circuit, and when the semiconductor switch is turned off, the secondary side circuit is configured to replenish the voltage across the capacitor of the external bootstrap circuit.

In another aspect, a method is provided for providing a drive circuit configured for controlling operation of a semi- conductor switch. The method comprises operably coupling a primary side circuit to a primary winding of a transformer, the primary side circuit operably coupled to a primary side supply voltage and to an input signal, wherein the primary side circuit is configured to operably couple a first signal to the primary winding of the transformer. The method also comprises operably coupling a secondary side circuit to a secondary winding of the transformer, wherein the second- ary side circuit is in operable communication with a semi- conductor switch and wherein the secondary side circuit is configured to provide, in response to the first signal being coupled from the primary winding to the secondary winding, a second signal to control the semiconductor switch, wherein the second signal comprises at least one of a primary bias and a secondary bias, wherein: for a first range of gate charge levels required by the semiconductor switch, the secondary side circuit is configured to provides the primary bias; and for a second range of gate charge levels required by the semiconductor switch, where the second range of gate charge levels includes gate charge levels that are greater than those in the first range of gate charge levels, the secondary side circuit is configured to be controllable by a secondary bias circuit that is operably and removably coupled to the drive circuit, wherein the secondary bias circuit comprises a storage capacitor that is configured to accumulate voltage when the secondary side circuit is pro- viding the primary bias.

In some embodiments, the method further comprises configuring the secondary side circuit to further comprise a rectifier in operable communication with the secondary winding and a bias low dropout circuit in operable commu- nication with the rectifier; and disposing a boost tap point disposed in between the rectifier and the bias low dropout circuit, wherein the storage capacitor of the secondary bias circuit is operably coupled at a first side to the boost tap point and at a second side to an isolated output return for the secondary side circuit. In some embodiments, the method further comprises operably coupling a cathode terminal of a diode to the boost tap point and operably coupling an anode terminal of the diode to an isolated supply voltage, wherein the isolated supply voltage is electrically isolated from the primary side supply voltage.

In some embodiments, the method further comprises supplying the semiconductor switch with gate charge via a voltage stored on the storage capacitor when the semiconductor switch is turned on; and replenishing the voltage stored on the storage capacitor, via the diode, when the semiconductor switch is turned off. In some embodiments, the method further comprises providing the second signal when the semiconductor switch is closed. In some embodiments, second signal comprises a combined bias that comprises a logically OR'd combination of the primary bias and the secondary bias. In some embodiments, the method further comprises supplying the semiconductor switch with gate charge via a voltage stored on the storage capacitor when the semiconductor switch is turned on; and replenishing the voltage stored on the storage capacitor, via the secondary side circuit, when the semiconductor switch is turned off.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the claims included herein.

Details relating to these and other embodiments are described more fully herein.

BRIEF DESCRIPTION OF THE DRAWINGS

The advantages and aspects of the described embodiments, as well as the embodiments themselves, will be more fully understood in conjunction with the following detailed description and accompanying drawings, in which.

The drawings are not to scale, emphasis instead being on illustrating the principles and features of the disclosed embodiments. In addition, in the drawings, like reference numbers indicate like elements.

DETAILED DESCRIPTION

Figure 1:
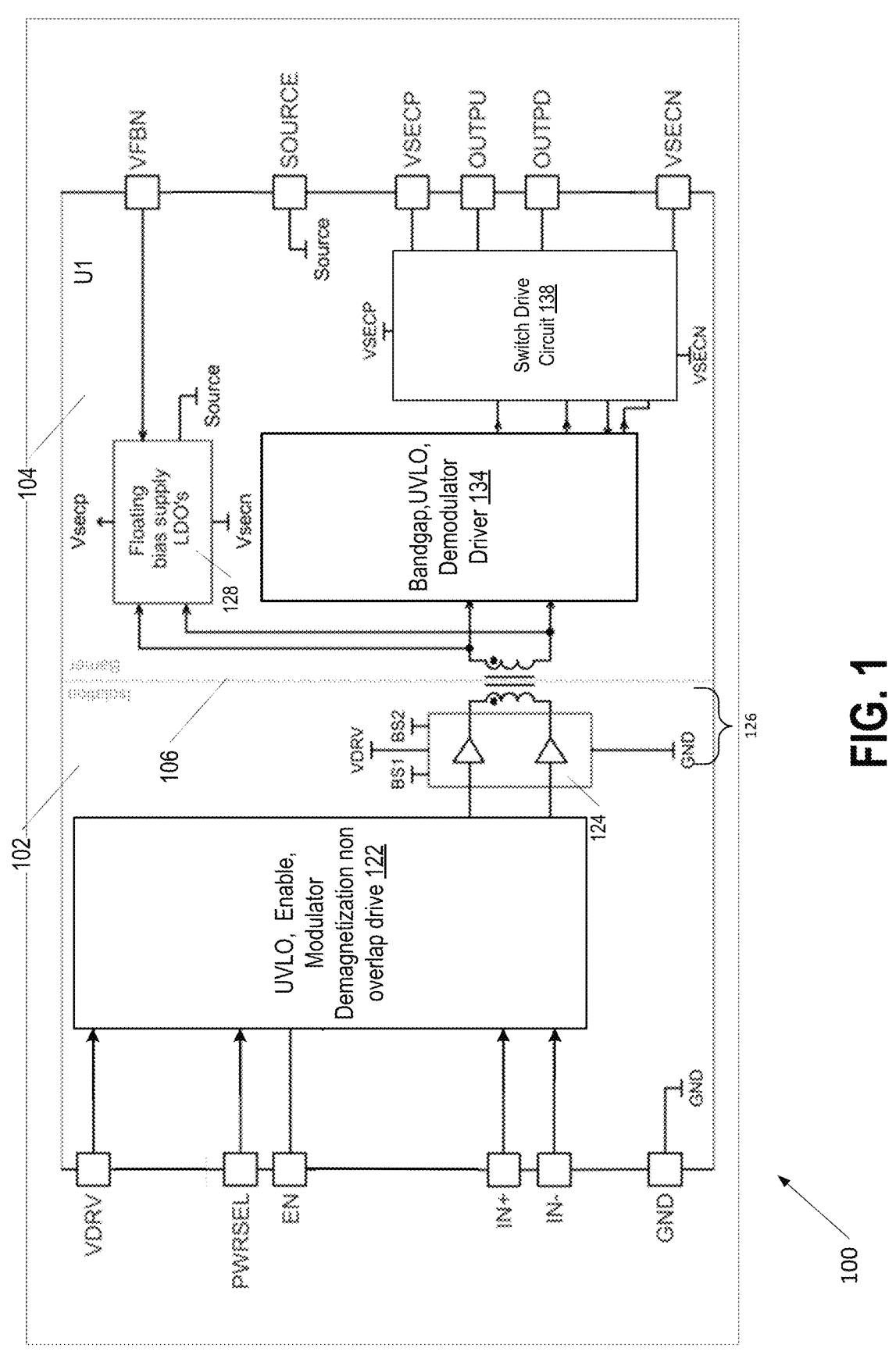
FIG. 1 is a functional block diagram of a first embodiment of an isolated gate drive circuit, in accordance with one embodiment.

Before describing details of the particular systems, devices, and methods, it should be observed that the concepts disclosed herein include but are not limited to a novel structural combination of components and circuits, and not necessarily to the particular detailed configurations thereof. Accordingly, the structure, methods, functions, control and arrangement of components and circuits have, for the most part, been illustrated in the drawings by readily understandable and simplified block representations and schematic diagrams, in order not to obscure the disclosure with structural details which will be readily apparent to those skilled in the art having the benefit of the description herein. In addition, the following detailed description is provided, in at least some examples, using the specific context of antenna elements and related RF circuits, but this is merely exemplary and not limiting. It should be appreciated that such references and examples are made in an effort to promote clarity in the description of the concepts disclosed herein. Such references are not intended as, and should not be construed as, limiting the use or application of the concepts, systems, arrangements, and techniques described herein to use solely with these or any other systems.

In addition, it is noted that various connections are set forth between elements in the following description and in the drawings. These connections in general and, unless specified otherwise, may be direct or indirect, and this specification is not intended to be limiting in this respect. In this disclosure, a coupling between entities may refer to either a direct or an indirect connection. It should be understood that throughout the drawings, corresponding reference numerals indicate like or corresponding parts and features. As used herein, the term module, unit and/or element can be formed as processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

Additionally, use of the term "signal" in conjunction with this disclosure is not limited to analog and/or digital signals but rather is meant to denote as well (1) the mathematical description of any measurable phenomena in nature or in human-made systems and (2) the mathematically described function of one or more variable depending on one or more parameters. Examples of types of signals which are encompassed in the embodiments described herein include, but are not limited to, light intensity, voltage, pressure, electromagnetic radiation (including radio waves), magnetic field strength and electric field strength.

Isolated gate driver circuits enable the transfer of data and power between the high-voltage and low-voltage domains, while providing system and human protection from hazardous direct current. Each gate driver provides a specific control voltage for each of the power switches within the design, where the voltage needed for one switch may differ from the voltage needed for another. Because device switching speed and output quality greatly affect the power conversion, matching the requirements of the switches to the gate drivers is advantageous to achieving the desired system performance. Thus, to help design an isolated gate driver, factors such as cost, size, weight, reliability, and efficiency of the power-conversion system must be weighed with consideration for the influencing factors, including the environmental conditions presented at the location where the gate driver is placed, component count, and design complexity. The wide variety of conditions that a gate driver will face heavily influence performance, as is understood in the art.

In at least some known isolated gate driver designs, external DC-DC bias supplies are used to drive the gates of the power transistors. In some applications, there may need to be eight or nine separate bias supplies, with each supply adding transformers and other bulky components that degrade reliability and increase solution size. Having multiple bias supplies brings new potential points of failure, as is understood. Further, the bias supplies may need to be sized for the highest operational switching frequency, which results in less-efficient operation at lower frequencies.

An alternative method to provide an additional power rail to serve as the external bias supply for the isolated gate driver is to use bootstrap circuitry, where an exemplary bootstrap circuit includes a diode, a capacitor, and—in some cases—a resistor. A bootstrap circuit is arranged so that, when the low-side switch is turned on, the capacitor is charged via the diode almost to the level of the supply voltage (Vdd). The capacitor subsequently provides the drive power for the high-side switch. This arrangement presents its own challenges in selection of bootstrap components. For example, the diode may require a reverse voltage rating that is higher than the high-voltage bus and, in applications with high-frequency switching, may need to be rated for fast recovery. The capacitor may need to be small enough to recharge quickly, but large enough to supply the required gate charge for the switch without becoming discharged too quickly. The resistor, if required, may need to limit the spikes of charging current flowing into the bootstrap capacitor. This is because all bootstrap designs have the potential for false overcurrent tripping, which would occur if the charging current in the low-side current sense signal to the controller were to spike with sufficient amplitude at the capacitor. To prevent false overcurrent tripping, the amplitudes of such potential spikes must be limited, e.g., via a resistor in series with the diode. However, larger resistor values may require a larger capacitor, which takes more time to charge at startup and thereby delays the availability of high-side drives. Moreover, if the capacitor is too small, supplying the required gate charge to the high-side switch will come with too much droop in the gate voltage. Together, these requirements typically result in a need that, in many conventional circuits, can only be filled by large and relatively expensive components.

The assignee of the present disclosure developed and patented an advantageous arrangement for providing isolated gate drivers wherein the bias supply system is embedded within the driver, so that the isolated gate driver does not require an external auxiliary supply. This arrangement, referred to as Power-Thru technology, includes two gate drive ICs and a tiny magnetic-based isolation structure that enables efficient power transfer across the boundary from the low-voltage signal to the high-voltage system. The patented Power-Thru technology includes a circuit design that allows the IC to manage both the gate drive signal and the transfer of energy from the primary IC to the secondary gate driver IC across the magnetic isolation barrier. This novel technology enables the isolation boundary to carry the drive power required to drive both the external FET switch and the gate drive signal data. The transformer thus transfers the gate on/off logic signal along with the power needed to drive the gate of the switch, eliminating the need for external auxiliary power.

Because complete electrical isolation is provided by the magnetic coupling, Power-Thru drivers are equally suitable for use in high-side, low-side, and isolated applications. In addition, in some cases, devices implemented with Power-Thru technology may remove the need for a bootstrap circuit or an external isolated DC-DC source to create the floating voltage required for controlling high-side switches. By eliminating the need to provide an external bias power supply, tradeoffs and complexity in choosing the optimal combination of components can be reduced. The resultant reduced component count leads to both a smaller size circuit as well as fewer points of failure, increasing reliability. The reduced component count also results in smaller gate driver assemblies with shorter signal paths, which can lead to reduced parasitic capacitance and inductance, which helps reduce risk of damage caused by ringing and voltage spikes. In addition, Power-Thru technology enables the gate driver to track the power consumption of the gate control with the switching frequency, enabling automatic optimization of efficiency. At least some embodiments of related architectures, which are applicable to be combined with other teachings herein, are discussed in the following commonly assigned U.S. patents and patent publications, which are hereby incorporated by reference:

U.S. Patent Publication No. 2023/0353145 A1, entitled, "Low-latency switch drive circuit with power transfer," published on Nov. 2, 2023;

U.S. Pat. No. 11,764,778, entitled "Low-latency switch drive circuit with power transfer," issued on Sep. 19, 2023;

U.S. Pat. No. 11,211,929, entitled "Galvanically Isolated Low-Latency Switch Drive Circuit with Power Transfer," issued on Dec. 29, 2021;

U.S. Pat. No. 11,201,619, entitled "Isolated High Side Drive Circuit," issued on Dec. 14, 2021;

U.S. Pat. No. 11,082,038, entitled, "Gate Driver Isolating Circuit," issued on Aug. 3, 2021; and U.S. Patent Publication No. 2021/0376822, entitled, "Galvanically Isolated Driver Package for Switch Drive Circuit with Power Transfer," published on Dec. 2, 2021.

In addition, at least some further embodiments of related architectures, which are applicable to be combined with other teachings herein, are discussed in the following datasheets available from Allegro Microsystems, which are hereby incorporated by reference:

AHV85110 "Self-Powered Single-Channel Isolated GaN FET Driver with Power-Thru Integrated Isolated Bias Supply;" and AHV85111 "Self-Powered Single-Channel Isolated GaN FET Driver with Regulated Bipolar Output Drive."

In addition, at least some details of the Power-Thru architectures that is applicable to be combined with other teachings herein, is discussed in a paper available from Allegro MicroSystems and entitled, "Solving the Challenges of Increasing Power Density by Reducing Number of Power Rails," dated Mar. 28, 2023, by Andy Wang, which is hereby incorporated by reference.

Driving FETs in an isolated power conversion system may pose additional design challenges, because isolated power conversion systems may require an isolated power supply and/or bootstrap components, which can reduce efficiency and increase component count in the power conversion system, adding complexity and cost. As is understood, isolation may be needed in gate driver circuits for various reasons, such as operational considerations as well as safety reasons. In some circuits, such as half-bridge circuits where only one switch is one at a given time, operational isolation may be needed to help level shift the signals needed to turn on a given switch, so that the signals needed to turn on a given transistor are capable of being provided within the circuit versus having to have signals larger than, e.g., a bus or rail voltage. As a safety consideration example, galvanic isolation may be required between a high power side and a lower power control side if human users are involved on the control side, because the isolation helps to protect the human user from any high side faults (e.g., component failure or damage) that could result in electrical shock or other dangerous levels of electrical power and/or current reaching a user on the control side. Isolation also can protect low side components from electrical damage if there are faults on the high side.

In addition, at least some current gate driver architectures (such as the aforementioned ALLEGRO Power-Thru architectures) rely on a tightly-coupled magnetic structure (transformer) to deliver power from the primary to the secondary isolated side. The product's maximum power delivery directly influences the dimension of various system components, such as the transformer driver on primary integrated circuit (IC) side, the transformer itself, and/or a rectifier on the secondary IC side. This can contribute to the cost and dimension of the final product.

Application-wise, in at least some arrangements, the gate driver capability is determined by the driven transistor total gate charge and recommended voltage levels, and converter switching frequency. While voltage levels and switching frequencies are somewhat bounded by industry standards and other components characteristics, transistor gate charge can easily range by an order of magnitude, for example between 20 nano-Coulombs (nC) and 200 nC. A gate driver able to accommodate a 200 nC gate charge might not be competitive in applications where a 20 nC transistor suffices.

At least some embodiments described herein attempt to mitigate the above trade off and other issues. At least some embodiments herein leverage and improve the Power-Thru arrangement to flexibly allow an external boot-strap capability with the Power-Thru arrangement, to help increase gate charge handling capability in higher power applications. At least some embodiments herein are based on the ability to OR two different supply schemes by providing various embodiments of an improved isolated gate driver circuit, as described herein.

To better explain the advantages and features of the embodiments described herein, an exemplary isolated gate drive circuit, which can be modified, improved, and connected to, to implement and provide the advantages described herein, is first described. In particular, FIGS. 1-7 herein describe various embodiments of an exemplary isolated gate drive circuit usable to implement the external bootstrap arrangement for higher power operations, and FIGS. 3-7 describe particular modifications to the circuit of FIG. 1, including components to connect and where to make the connection, to provide the external bootstrap operation for higher power operations.

Figure 2:
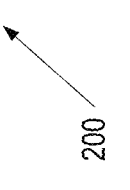
FIG. 2 is an exemplary block diagram of a simplified application circuit for the isolated gate drive circuit of FIG. 1, in accordance with one embodiment.

FIG. 1 is a functional block diagram of a first embodiment of an isolated gate drive circuit 100 (referred to herein as "driver 100"), in accordance with one embodiment. The driver 100 of FIG. 1 is available from ALLEGRO MICROSYSTEMS of Manchester, New Hampshire, U.S.A. and is configured to implement the aforementioned Power-Thru architecture. In addition, the driver 100 is configured to be optimized for driving discrete SiC FETs in multiple applications, including but not limited to automotive On-Board Chargers (OBC), solar inverters, industrial robotics and general power supply applications. For example, FIG. 2 is an exemplary block diagram of a simplified application circuit 200 for the driver 100 of FIG. 1, in accordance with one embodiment. The simplified application circuit 200 shows a first driver 103 ("U1" in FIG. 2) driving a first SiC FET Q1 and a second driver 105 ("U2" in FIG. 2) driving a second SiC FET Q2.

The driver 100 has fast propagation delay and high peak source/sink capability to efficiently drive SiC FETs in high-frequency designs, such as that shown in FIG. 2. High common mode transient immunity (CMTI) combined with isolated outputs for both bias power and drive make it ideal in applications requiring isolation, level-shifting, or ground separation for noise immunity.

In certain embodiments, the driver 100 provides for both control and power transfer, by transmitting pulses from the primary side 102 (i.e., primary side circuit) to the secondary side 104 (i.e., secondary side circuit), by transmitting pulses to a first (primary side 102) winding of a pulse transformer 126 to a second (secondary side 104) winding of the pulse transformer 126. The pulse transformer 126, in certain embodiments, is an isolation transformer capable of operation at the speeds needed for the given application, e.g., a half-bridge gate driver application (on the order of 1 MHz). Pulses received at the secondary side 104 are provided to an internal power supply circuit (not shown explicitly in FIG. 1, but part of the floating bias supply low dropout (LDO)'s circuit 128 on the secondary side 104, as will be understood), also referred to herein as bias low dropout circuit (bias LDOs circuit) 128, which converts them to a secondary side 104 supply voltage (VSECP, VSECN). In some embodiments, the primary side 102 receives input signals at the IN+ (non-inverting pulse width modulated input) and IN− (inverting pulse width modulated input), and the primary side 102 derives switch instructions from states of the inputs IN+, IN−.

For example, in some embodiments, the input at either IN+ or IN− may be interpreted to have two states, high and low. If the state of input IN+ (as an example) is considered "high" it is assumed that an external switch (discussed further herein in connection with FIGS. 5 and 6) driven by the secondary side 104 (or floating side) of the driver 100 needs to be turned on. In contrast, if the state of input IN is considered "low" it is assumed that the external switch needs to be turned off. In alternative implementations, input IN may have more states (such as a "float" state, neither high nor low), upon which the driver 100 may enter alternative modes of operation.

An isolated dual positive/negative output bias supply is integrated into the driver 100, eliminating the need, in at least some applications, for external gate drive auxiliary bias supply or high-side bootstrap. However, as discussed further herein, there are external bootstrap modifications that are possible to the driver 100, as discussed further herein in FIGS. 3-7, which can enable the driver 100 to scale up power as needed for high power applications, without requiring significant changes to the driver 100 itself.

Referring again to FIG. 1, on the primary side 102 (also known as low side 102) of the isolation barrier 106, the input pins are connected and function as described below. The primary side 102 is supplied by primary side supply voltage VDRV, and, as will be appreciated, other supply voltages that the primary side 102 might need can be derived from VDRV via optional linear regulators. In certain embodiments, the primary side 102 of the driver 100 only requires a single 12-V rail to power the driver 100; power for the isolated secondary-side bias rail (i.e., VSECP, VSECN) is generated from the primary 12-V rail, and no secondary side 104 bias supply is required. In certain embodiments, the power for the isolated secondary-side bias rail and for other secondary side power is generated in a way that it is electrically isolated from the primary 12-V rail.

At startup, the primary side 102 circuit stays in a low-power standby mode until VDRV exceeds a predetermined rising threshold, and no power is transferred to the secondary side 104 circuit. While running, if VDRV falls below the predetermined threshold, the signal and power transfer to the secondary side 104 circuit are halted. When the VDRV level recovers and exceeds the predetermined threshold again, the system restarts. In certain embodiments, the drive circuit 124 in FIG. 1 is configured to differentially drive the primary winding of pulse transformer 126. In certain embodiments, the pulse transformer 126 can be configured to have two windings on the secondary, which are configured to drive each gate of a half bridge. An advantage of using a pulse transformer is that it does not require isolated power supplies to drive the secondary side MOSFETs.

In FIG. 1, if the EN input is held low, the primary side 102 stays in a low power standby mode. Once EN goes high, then the primary side 102 of driver 100 enables power transfer to the secondary side 104, to charge the secondary-side isolated bias rails (i.e., VSECP, VSECN). When the secondary side 104 bias rails (VSECP, VSECN) have settled to the target regulation levels, then this indicates to a system controller or any other entities that are in operable communication with the driver 100 (note that other entities such as a system controller are not shown in FIG. 1 but are well understood in the art) that the driver 100 is ready to accept pulse width modulated (PWM) inputs (e.g., at IN+ for PWN non-inverting input and IN– for PWN inverting input).

When de-asserted (i.e., EN goes low), signal EN (enable input) instructs the driver 100 to enter a disabled mode. Disabled modes may be used to reduce the supply current of the switch driver. When asserted (EN goes high), signal EN enables the driver 100 and instructs it to enter normal operating mode. Upon entering a primary side 102 fault condition, such as operating voltage VDRV dropping below a sufficient level, also known as Under-Voltage-Lockout (UVLO) the driver 100 itself may de-assert EN. When implemented in a bidirectional fashion, signal EN may be de-asserted by either an external controller, (not shown in FIG. 1) or by the driver 100, allowing both devices to respond to fault conditions in a desirable synchronized fashion. A bidirectional signal EN may be implemented using a wired-AND connection structure which would be familiar to those skilled in the art. For example, a shared EN line, in certain embodiments, can be connected s a wired-AND with an external controller EN pin (not shown), as will be understood. In some embodiments, multiple drivers can be connected in parallel with the controller on a shared EN line, such that all connected drivers will hold the EN line low until all drivers and the PWM controller have released their own EN pin, ensuring smooth safe startup of a system that includes all drivers and the controller. The EN pin can be pulled low to disable transfer of PWM signals (IN+, IN–) to the output and to put the driver 100 into a low-power mode. Pulling EN low is also configured to disable the isolated secondary bias rails VSECP, VSECN.

The outputs of the modulator demagnetization non-overlap drive circuit 122 are connected to the drive circuit 124. The pulse transformer 126 couples the output of the drive circuit 124 of the primary side 102 to the secondary side 104 (high side 104) and helps to provide galvanic isolation.

The driver 100 includes two PWM input pins IN+ (PWM non-inverting) and IN–, (PWM inverting) which are inputs to the modulator demagnetization non-overlap drive circuit 122. The IN+ and IN-inputs can be used to drive the PWM (part of the modulator demagnetization non-overlap drive circuit 122) with normal positive logic, using IN+ only, with IN-tied to GND. Alternately, with inverted negative logic, the PWM can be driven by using IN–, with IN+ tied to REF. In certain embodiments, both PWM input pins are compatible with standard 3.3-V or 5-V logic signals from a system controller (not shown).

In certain embodiments, if the switch instructions received at one of IN+/IN-indicate that an external switch (e.g., Q1 or Q2 in FIG. 2, discussed further herein) is to be turned on, then pulsed information is sent from primary side 102, through pulse transformer 126, to the secondary side 104 of the driver. Circuits on the secondary side 104, including those within the floating bias supply LDO's circuit 128 convert the pulsed information that is received into secondary side 104 voltages VSECP and VSECN. The pulsed information also is provided to the demodulator driver circuit 134, which implements a control function to provide control signals (OUTPU, OUTPD) that help to operate the external switch being controlled (e.g., as shown in FIG. 2 herein and in FIG. 5 herein).

Referring still to FIG. 1, on the secondary side 104 (high side 104) of the isolation barrier 106, the outputs of pulse transformer 126 are provided to a floating bias supply LDO's circuit 128, which also has a signal VFBN (feedback input for VSECN regulator) as input. The outputs of the floating bias supply LDO's circuit 128, as noted previously, include the positive gate drive rail VSECP and the negative gate drive rail VSECN. The floating bias supply LDOs circuit 128 is also connected to the SOURCE pin (isolated output return pin for the rails). The VFBN input is used, in certain embodiments, to help adjust a regulated VSECP level and can be coupled to the midpoint of a resistor divider to set output voltage between the VSECP and SOURCE pins, as is understood in the art. In certain embodiments, the floating bias supply LDO's circuit 128 includes a built in rectifier, which is configured to help turn bipolar pulses from pulse transformer 126 into control signals into bias low dropout (bias LDOs) built into the floating bias supply LDO's circuit 128. As will be discussed further herein, in FIG. 3, the driver 100 is modified to separate out the rectifier function to provide a tap point to allow providing higher levels of gate charge.

The secondary side 104 includes a secondary driver, which is part of the demodulator driver circuit 134. The outputs of pulse transformer 126 are also provided to the demodulator driver circuit 134. The outputs of the demodulator driver circuit 134 are provided to a switch drive circuit 138 which includes two independent paths for pull-up (OUTPU) and pull-down (OUTPD), to allow separate tuning of turn-on and turn-off speed with external gate resistors.

Referring again to the secondary side 104 of the driver 100 of FIG. 1, this circuit includes bipolar output rails (i.e., VSECN and VSECP) that feature a selectable regulated positive rail, and adjustable negative off-state rail for improved dv/dt immunity. This feature greatly simplifies the system design and reduces EMI through reduced total common-mode (CM) capacitance and also allows the driving of a floating switch in any location in a switching power topology. This makes it advantageous for halfbridge, multi-level topologies, and any topology with a floating or high-side switch. The positive gate drive bias rail VSECP is internally fixed and regulated. In certain embodiments, three voltage levels are available (+15 V, +18 V or +20 V), to suit a wide range of different SiC FET devices. As will be discussed further herein in connection with FIGS. 3-7, the driver 100 can be modified to increase the gate charge handling capacity in higher power applications.

Figure 3:
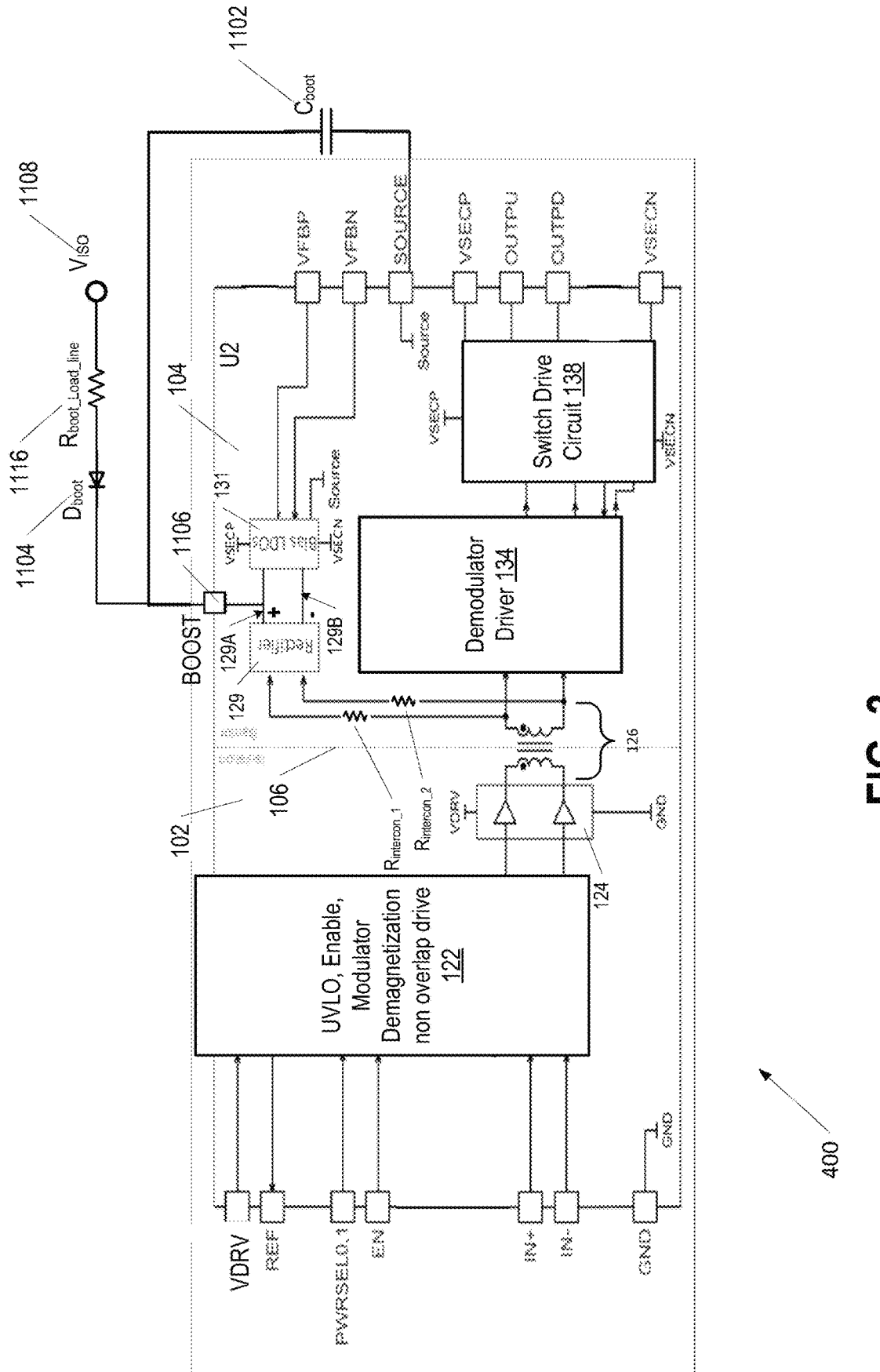
FIG. 3 is a functional block diagram of a first modified version of the first embodiment of an isolated gate drive circuit of FIG. 1, showing a first embodiment of a power through booster modification of the circuit of FIG. 1, including a further modification of the circuit of FIG. 1, in accordance with one embodiment.

Referring still to the secondary side 104 of the driver 100 of FIG. 1, the SOURCE output is an isolated output return pin. In some embodiments, the SOURCE serves as the main OUTSS pin and is always connected to an isolated system ground; advantageously, to improve thermal performance, SOURCE may be connected to a large ground plane. The positive gate drive bias rail VSECP is internally fixed and regulated. In certain embodiments, three voltage levels are available (+15 V, +18 V or +20 V), to suit a wide range of different SiC FET devices. The negative bias rail VSECN can be adjusted by suitable choice of external resistor divider on the VFBN pin, as shown in FIG. 3.

In certain embodiments, the driver 100 is optimized for driving discrete SiC FETs, like those shown in the example application of FIG. 2, with total gate charge QG (TOT) levels up to 130 nC (at total Vgs swing up to 25 V). In certain embodiments, the maximum allowable PWM frequency for the driver 100 is 400 kHz. However, as will be understood in the art, the VDRV level, the load total gate charge QG (TOT), and the PWM frequency all contribute to the total package power dissipation, so care must be taken to ensure that implementations that use the driver 100 are configured to ensure that the driver 100 is operated within its maximum power dissipation safe operating area as a function of ambient temperature. This means that, in some embodiments, SiC FETS with lower gate charge can be driven to the higher end of the PWM frequency range, subject to package power dissipation. But if the maximum gate charge capability is used, the PWM maximum frequency must be derated, to stay within the package thermal capability, as is understood in the art.

As discussed above, the capability of driver circuits such as the driver 100 of FIG. 1, is determined by the driven transistor total gate charge (transistor current needed to turn on a MOSFET, such as one being driven by the driver 100) and recommended voltage levels, and converter switching frequency. As noted previously, industry standards and component characteristics effectively dictate limits on the ranges of voltage levels and switching frequencies. However, transistor gate charge can have much wider ranges and can range by an order of magnitude, such as between 20 nC and 200 nC. However, it can be costly and inefficient to configure the driver 100 of FIG. 1 so that it always has the ability to provide the 200 nC amount of gate charge, when in many applications a significantly smaller amount of gate charge (20 nC) is sufficient.

In some applications, there may be a need to be able to provide a driver arrangement that can be suitable for a range of gate charges that can have as large a range as possible of gate change, without requiring redesign or reconfiguration of internal driver components. This can enable a gate driver such as the driver 100 of FIG. 1 to be designed into a higher power application, such as by the addition of a few external bootstrap components, if needed. Advantageously, it also would be desirable to be able to use the driver 100 of FIG. 1 without an external bootstrap in lower power/lower gate charge applications, then to be able to adapt the driver 100 of FIG. 1 to work with higher power levels via a simple external bootstrap circuit.

The modifications to the driver 100 of FIG. 1, discussed below in connection with FIGS. 3-7, FIGS. 3-7 allow a driver, such as the driver 100, to be adapted to provide a wider range of gate charge, to be able to drive MOSFETS having a wider power range, without requiring internal design modifications. In certain embodiments, as noted herein, the driver 100 is configured by design with internal, built-in circuits and components (e.g., internal transistors) that are, by default, configured and designed to handle the lower levels of gate charge, to help minimize device cost. However, with the added modifications described herein, in connection with FIGS. 3-7, the driver 100 has a modification that does not require extensive internal redesign, which enables the driver 100 to be coupled to components that allow the driver 100, on an as needed basis, to handle significantly larger amounts of gate charge. In certain embodiments, the modification involves separating certain secondary side functions to allow coupling certain power through boost components (discussed further herein), which are external to the driver 100, to certain input and output pins on the driver and to a new circuit connection to an internal driver circuit on the secondary side 104. In certain embodiments, the modifications to the driver, as shown in FIGS. 3-7 herein, help to provide an adaptable driver that can be configured to drive a wide range of gate charges (i.e., range of gate charge levels), including for higher power levels, with only the addition of simple bootstrap components.

FIG. 3 is a functional block diagram of a first modified version 400 of the of the driver 100 of FIG. 1 (referred to herein as "first modified driver 400"), showing a first embodiment of a power through booster modification of the driver 100 of FIG. 1, in accordance with one embodiment. This first modified driver 400 (modified from the driver 100 of FIG. 1), showing a first embodiment of a power through booster modification of the driver 100 of FIG. 1, will be referred to hereinafter as "first modified driver 400". The first modified driver 400 has a few internal differences with the driver 100 of FIG. 1 (which forms the basis of the first modified driver 400 of FIG. 3). Except as described below, the basic main integrated circuit, labeled as U1 in FIGS. 1 and U2 in FIG. 3, are substantially similar. Accordingly, components having the same number in both FIG. 1 and FIG. 3, have the same purpose and operation, and these functions are not repeated here unless there is some difference that is pertinent to the description of either or both of the driver 100 and the first modified driver 400 and second modified driver 800 (discussed further herein in connection with FIG. 7). However, FIG. 1 and FIG. 3 do differ in certain internal components, especially on the secondary side, as discussed below.

For example, FIG. 3 includes additional and/or reconfigured components that enable the first modified driver 400 to have flexibility to work with large ranges of gate charge, wherein the first modified driver 400 provide a bootstrap function for certain levels of gate charge, and where the first modified driver 400 has internal circuit changes that, in cooperation with these additional components, provide an advantageous power through booster function that optimizes the above-described Power-thru feature, to enable the first modified driver 400 to drive a certain power level without an external bootstrap and to use the additional components to allow the same first modified driver to work at higher power levels.

On the secondary side of the first modified driver 400, the floating bias supply LDO's circuit 128 of the driver 100 has been modified in the first modified driver 400 by breaking this function into two separate circuits having separate functions: a rectifier circuit 129 (which advantageously, in some embodiments, is implemented using a half-bridge rectifier, but this is not limiting) and a DC voltage regulator circuit, which in this example embodiment is a bias LDO's circuit 131. The inputs to the rectifier circuit 129 include the control signal outputs of pulse transformer 126, and each control signal coming from pulse transformer 126 has an associated respective interconnect resistance Rintercon_1 (which is associated with the control signal representing positive pulses) and Rintercon_2 (which is associated with the control signal representing negative pulses). The rectifier circuit 129 has a positive output 129A and a negative output 129B. The positive output 129A and negative output 129B of rectifier circuit 129 are provided as first inputs to the bias LDO's circuit 131, which is configured to provide the positive gate drive rail VSECP and negative gate drive rail VSECN as outputs. In addition, as shown in FIG. 3, the positive output 129A of the rectifier circuit 129 is connected to a BOOST tap point 1106 (discussed further herein). The SOURCE connection (isolated output return pin) also is connected to the Bias LDO's circuit 131. As noted above, there is a first boost tap point 1106 (i.e., a tap point connection) connected to one of the two inputs to the Bias LDO's circuit 131, in this example the control signal associated with positive pulses (and coupled to the positive output 129A of the rectifier circuit 129).

Figure 5:
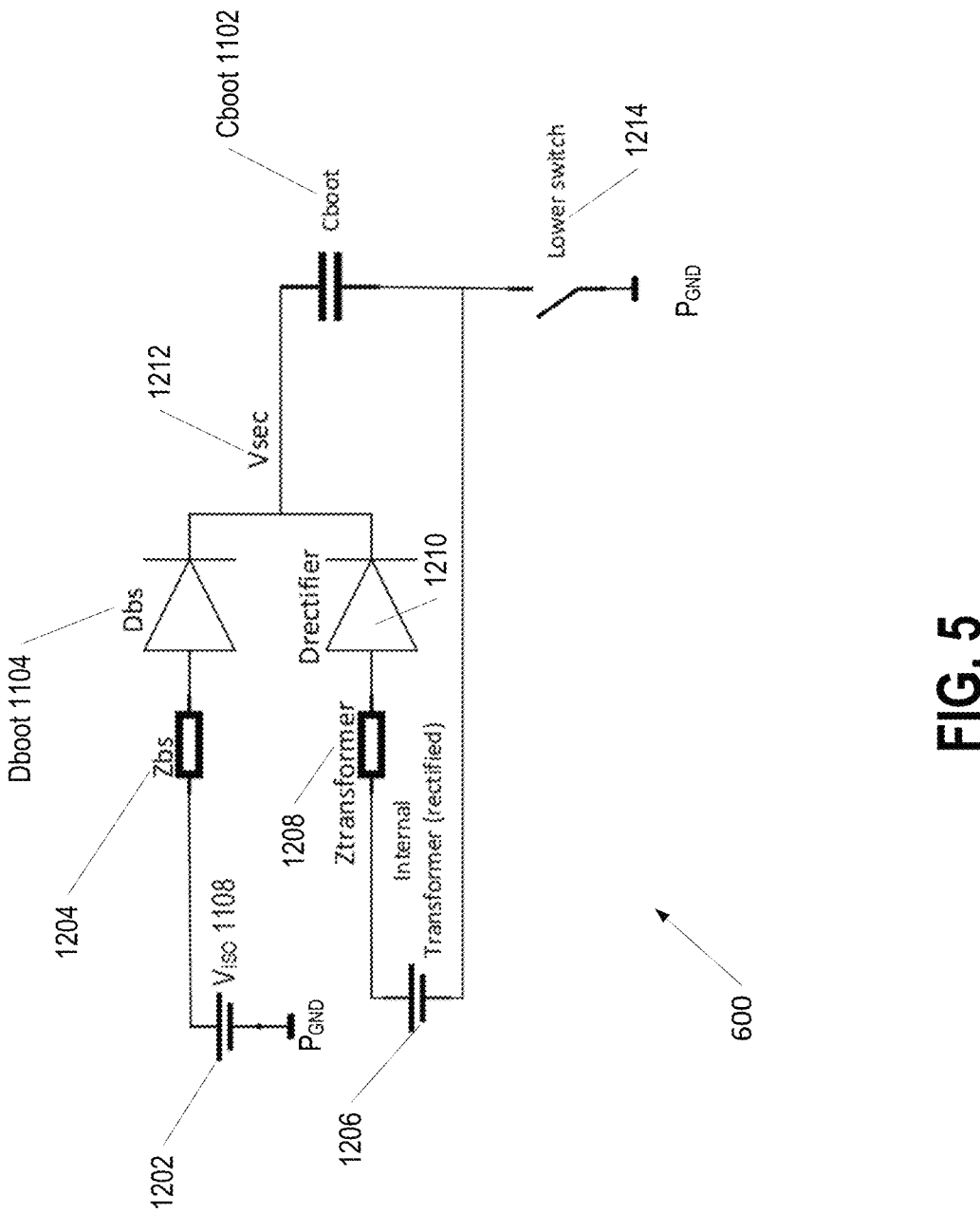
FIG. 5 is a simplified functional block diagram of a portion of the isolated gate drive circuit of FIG. 4 and portions of the simplified application circuit of FIG. 3, showing equivalent circuits for a bootstrap circuit and internal transformer supply and switch being driven, in accordance with one embodiment.

As explained further herein in connection with FIG. 5, via the first boost tap point 1106, the arrangement of inputs to the Bias LDO's of the first modified driver 400 effectively provides two alternate sources of bias voltage into the bias LDO's circuit 131, where these alternate sources of bias voltage are logically OR'd together at an input to the bias LDO's circuit 131. The level of positive rail VSECP and negative rail VSECN, along with the corresponding gate charge, that the bias LDO's circuit 131 provides, is at least partially dependent on the resultant level of the logically OR'd together inputs that comprise the output of rectifier circuit 129 and the voltage at the cathode of diode Dboot 1104. This is all explained further herein in connection with FIGS. 5 and 6.

As FIG. 3 illustrates, the first modified driver 400 of FIG. 3 provides a first boost tap point 1106, labeled as "BOOST." The first boost tap point 1106 is configured to OR the signal at the output of the added diode Dboot 1104, with the positive output 129A of rectifier circuit 129, to be provided as an input to Bias LDO's circuit 131. The first boost tap point 1106 is coupled to the source return via capacitor Cboot 1102. As is understood in the art, capacitor Cboot 1102, in certain embodiments, comprises first and second plates. As shown in FIG. 3, a first plate of capacitor Cboot 1102 is connected to a cathode terminal of diode Dboot 1104 and a second plate of capacitor Cboot 1102 is connected to the SOURCE terminal of first modified driver 400. As will be discussed below in connection with the subcircuit 1150 of application circuit 500 of FIG. 4 and effectively is coupled to ground. The anode terminal of diode Dboot 1104 is operably coupled to one terminal of load line resistor Rboot_load_line 1116, and the other terminal of load line resistor Rboot_load_line 1116 is connected to isolation voltage V_{ISO} 1108. Isolation voltage V_{ISO} corresponds to a power supply voltage that is electrically isolated from the primary side supply voltage VDRV, which is referred to herein, in certain embodiments, as an isolated supply voltage. Having isolation voltage V_{ISO} be electrically isolated helps to ensure isolation between the primary side 102 and the secondary side 104, as will be understood. The forward biased diode Dboot 1104 and the load line resistor Rboot_load_line 116 are coupled between the isolation voltage V_{ISO} and the first boost tap point 1106, which is a connection point to connect to an internal circuit on the secondary side of first modified driver 400. In particular, the first boost tap point 1106 is connected in between rectifier circuit 129 and bias LDO's circuit 131.

As those of skill in the art will appreciate, the values of capacitor Cboot 1102 and diode Dboot 1104 can be set based on the desired operation and gate charge needed. For example, when the first modified driver 400 is configured to charge a FET switch (not shown in FIG. 3, but similar to the applications shown in FIGS. 2, 4, and 5) coupled to the high side 104, the capacitor Cboot 1102 effectively serves as a bootstrap capacitor and provides a low impedance path to source the high peak currents on the secondary side 104 to charge the switch coupled to secondary side 104. Advantageously, capacitor Cboot 1102 is sized to have enough energy to drive the gate of the high-side switch (e.g., a MOSFET switch) being driven, without being depleted by more than a predetermined percent (e.g., around 10%.). Thus, capacitor Cboot 1102 advantageously can be about 10 times greater than the gate capacitance of the high-side switch, to allow for capacitance shift from DC bias and temperature, and also skipped cycles that occur during load transients.

The diode Dboot 1104 advantageously is a fast recovery diode or Schottky diode with low forward voltage drop and low junction capacitance. As is understood in the art, Schottky diodes help to reduce leakage current and help to minimize a risk associated with charge supplied back to the gate driver supply (e.g., a Vdd input into VDRV) from capacitor Cboot 1102. When the output OUTPU is pulled to a higher voltage, the diode Dboot 1104 preferably is able to reverse bias fast enough to block any charges from capacitor Cboot 1102 back to the VDD supply coupled into VDRV. Diode Dboot 1104, in some embodiments, is selected so that it can handle any peak transient currents during start-up and so that its voltage rating is higher than the system DC-link voltage by a predetermined margin.

The load line resistor Rboot_load_line 1116 provides a resistance that helps to limit the peak currents at the diode Dboot 1104 diode during start-up, resulting in a voltage that decreases over current. Advantageously, the load line resistor Rboot_load_line 1116 is selected to withstand high power dissipation during a time when capacitor Cboot 1102 is being charged, but care also should be taken regarding the RC time constant associated with the combination of Rboot_load_line 1116 and Cboot 1102, to ensure startup time requirements are met, because increasing either the boost capacitor or load line resistor will increase the time constant and slow down the startup time, as will be understood.

Together, the load line resistor Rboot_load_line 1116, capacitor Cboot 1102, and diode Dboot 1104 are referred to herein as the first boost components and, when combined, the first boost components are combined with the first boost tap point 1106, they form a first boost bootstrap arrangement, also referred to herein as a secondary bias circuit. The first boost tap point 1106 is selected because the internal supply system of the first modified driver 400 is establishing a baseline of power used to drive an externally connected MOSFET (e.g., similar to Q1, Q2 of FIG. 2), and the boost bootstrap arrangement helps to replenish the bulk of the baseline of power. In at least some embodiments, in exemplary applications of the circuit of FIG. 3, Cboot 1102 is configured to be biased from an additional isolated supply, and not the primary supply, to ensure isolation between primary and secondary. In addition, as FIG. 3 illustrates, connecting the first boost components to the isolation voltage V_{ISO} help to keep primary to secondary isolation.

By coupling the first boost components/secondary bias circuit to the specifically selected first boost tap point 1106, which is operably and removably coupled to an input on the secondary side 104, to V_{ISO} an isolated side bias supply voltage input and to the source connection, as shown in FIG. 3, the modifications in this arrangement, effectively allow the first modified driver 400 to provide two parallel power systems that are logically OR'd together to provide the necessary power as needed: one level of power for situations where the original power-through arrangement built into the first modified driver 400 (i.e., the arrangement as described for driver 100) is sufficient (i.e., lower gate charge applications) and one where a classic external bootstrap configuration (provided via the above-described first boost bootstrap arrangement) is used to provide sufficient gate charge for larger capacity MOSFETS and other transistors (e.g., MOSFETS that require a gate charge beyond a first predetermined limit,) without requiring extensive internal redesign of the original (FIG. 1) driver 100.

Up to a certain amount of gate charge (e.g., the first predetermined limit), the existing Power-Thru architecture suffices and the first bootstrap arrangement is not needed. For example, in an exemplary embodiment, the first predetermined limit is typically up to around 100 nC; however, those of skill in the art will appreciate that, for at least some embodiments, the first predetermined limit is not necessarily a fixed value and is dependent on the specific design and application parameters. In applications requiring higher gate charge beyond the first predetermined limit, the first boost components/secondary bias circuit cooperate(s) to provide sufficient gate charge, where the capacitor Cboot 1102 is replenished during operations of the power conversion circuit and/or of the circuit of FIG. 3. In addition, the capacitor Cboot 1102 is utilized by the bias supply arrangement on the secondary side, for the positive secondary supply, when the transistor gate charge needs to be provided for the external MOSFET switch being driven. The existing internal, built-in Power-Thru arrangement, discussed above in connection with the driver 100 of FIG. 1, is tasked to provide certain other functions, including establishing overall secondary rails (e.g., VSECP, VSECN OUTPU, OUTPD) at startup, which overcomes a drawback of classic bootstrap operations. In addition, the existing internal, built-in Power-Thru arrangement provides a positive bias (VSECP) and a negative bias (VSECN) for a pre-defined level of gate charge. Further, the existing internal Power-Thru arrangement supplies a negative rail (where little power is normally required).

In certain embodiments, a mode of operation is that the low gate drive and high gate drive systems work in tandem, such that a majority of the power is drawn by the bootstrap arrangement, but the voltage regulation is accomplished by the bias LDO's circuit 131 on the secondary side. This provides a hybrid arrangement, wherein the internal components on the first modified driver 400 (e.g., pulse transformer 126, rectifier circuit 129) are able to overcome limitations associated with known bootstrap circuits. In contrast, in conventional inverter configurations, there is no such an arrangement for an internal supply to help provide a baseline of power into the capacitor Cboot 1102, without waiting for the bootstrap.

Figure 4:
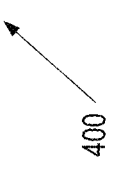
FIG. 4 is an exemplary functional block diagram of a simplified application circuit using the of the modified isolated gate drive circuit of FIG. 3.

During operation of the first modified driver 400 of FIG. 3, up to a certain predetermined amount of gate charge, the existing internal Power-Thru architecture (i.e., the signal path from pulse transformer 126 to rectifier circuit 129 to bias LDO's circuit 131) is sufficient, and if that is the only gate charge, then the first modified driver 400 of FIG. 4 actually would not need the boost components (i.e., would not need Rboot_load_line 1116, diode Dboot 1104 and capacitor Cboot 1102). This provides a primary IC bias arrangement. In applications where larger MOSFET switches and/or transistors are being driven, the first modified driver 400 provides a first boost tap point 1106 (internal connection point) for a secondary IC bias arrangement, enabling boost components to be added, and these boost components are replenished in classic bootstrap fashion during operations of the first modified driver 400. The capacitor Cboot 1102, which acts as a storage capacitor, is used by this secondary IC bias arrangement for the positive supply on secondary side 104 (i.e., VSECP), where a larger transistor gate charge is to be provided. Thus, when an externally driven switch is turned on via the circuit on the secondary side 104, the externally driven switch is supplied with gate charge via voltage stored on the capacitor Cboot 1102 of the external bootstrap circuit, and when the externally driven switch is turned off, the circuit on the secondary side 104 is configured to replenish the voltage across the capacitor Cboot 1102 of the bootstrap circuit.

Even with larger gate drive applications, the existing Power-Thru arrangement within the first modified driver 400 (i.e., the path from pulse transformer 126 to rectifier circuit 129 to bias LDOs 131) is still tasked to establish overall rails on secondary side 104 (i.e., VSECP, VSECN), which helps to overcome a major drawback of classic bootstrap operations. This existing Power-Thru arrangement also provides positive and negative bias for pre-defined levels of gate charge (e.g., those which are below a predetermined maximum amount). The existing Power-Thru arrangement also supplies the negative rail (VSECN), where little power normally is required.

FIG. 4 is an exemplary functional block diagram of a simplified application circuit 400 using two examples of the first modified driver 400 of FIG. 3 (shown as driver 403, labeled as "U1" in FIG. 4 and driver 405, labeled as "U2" in FIG. 4) as configured to drive a respective pair of FETs Q1, Q2. In the arrangement of FIG. 3, the source connection of Q2 and the source connection of each driver U2 (e.g., SOURCE of each of U1 and U2) are each connected to PGND (i.e., power ground the return current path for high power components, as is understood in the art). The functional block diagram of FIG. 4 includes pullup and pulldown resistors, respectively, on the outputs OUTPU and OUTPD.

For the modified driver U1 of FIG. 4, decoupling capacitor CSECP is connected between the SOURCE pin and the cathode terminal of diode Dboot 1104, and another decoupling capacitor CSECN_A is connected between the SOURCE pin and the negative gate drive rail VSECN of U1. Similarly. for U2, there is a decoupling capacitor Csecp_b between the source pin and the positive gate drive rail VSECP and a decoupling capacitor Csecn_b between the SOURCE pin and the negative gate drive rail VSECN. The rate of decay of VSECP and VSECN depends on the value of the CSECP and CSECN decoupling capacitors, as is understood; in addition, CSECP and CSECN help to supply the peak gate charge and discharge currents when the circuit of FIG. 4 is operating in applications requiring the lower levels of gate charge.

To better understand how the two parallel power systems of the first modified driver 400 of FIG. 3 interact, including in the application circuit 400 of FIG. 4, reference is now made to FIG. 5, which is a simplified functional block diagram 600 of a portion of the first modified driver 400 of FIG. 3 and as used in the application circuit of FIG. 4, FIG. 5 shows equivalent circuits for a bootstrap circuit and internal transformer supply, in accordance with one embodiment. As is understood, the rectifier circuit 129 of FIG. 3 behaves similar to a diode, allowing only uni-directional, DC current flow and blocking if any reverse voltage is applied, just like the external bootstrap diode Dboot 1104 of FIGS. 3, 4, and 5. Thus, the equivalent circuit in FIG. 5 has that representation. The switch labeled as "lower switch 1214" in FIG. 5 corresponds to a connection to an external MOSFET to be driven, similar to Q2 in the application example of FIG. 4. That is, U2 in FIG. 4 drives Q2, which corresponds to lower switch 1214 in FIG. 5. When U2 (FIG. 4) is "on", the lower terminal of capacitor Cboot 1102 thus is coupled to PGND (lower switch 1214 is closed). In this situation, $V_{ISO}$ forward biases diode Dboot 1104 and charges Cboot 1102.

Figure 6:
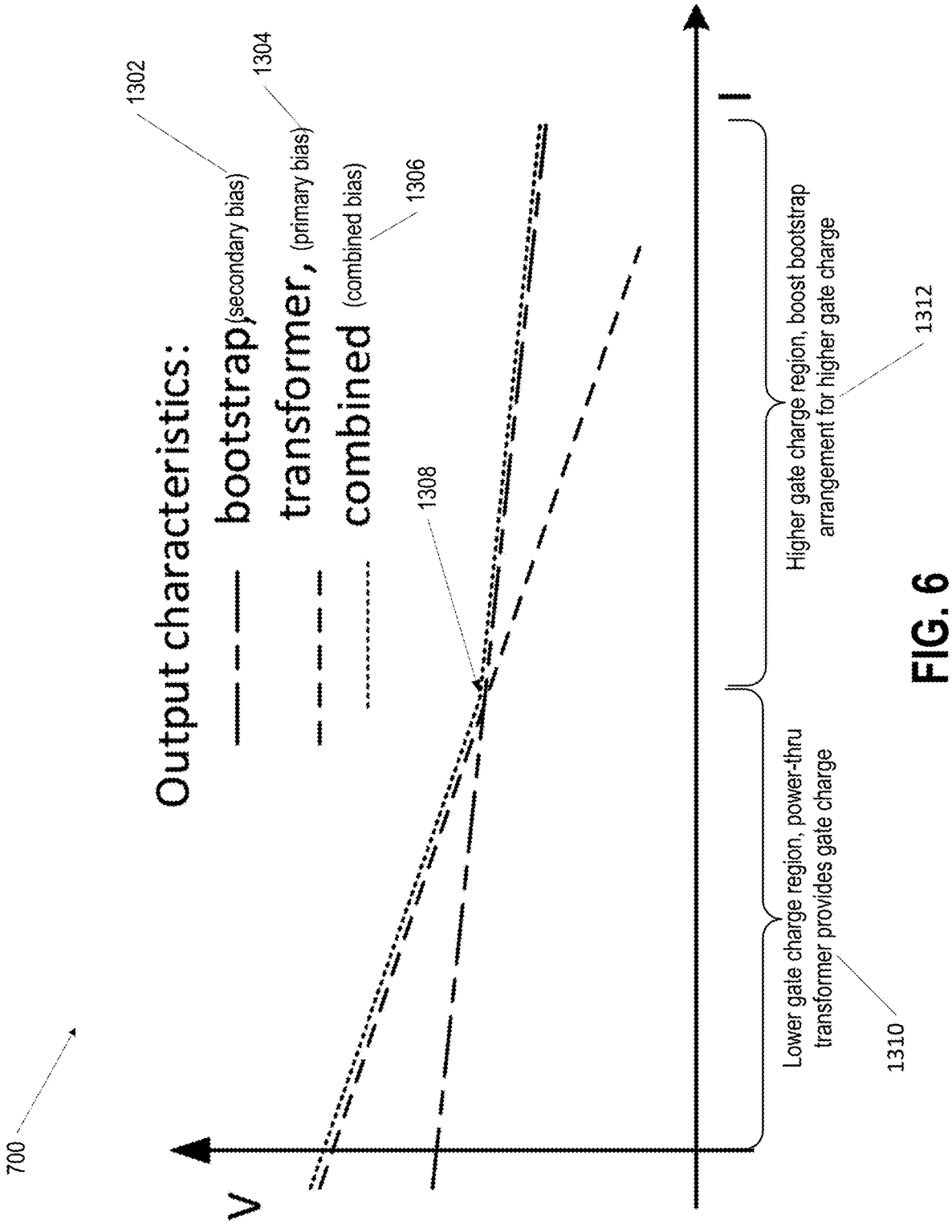
FIG. 6 is a graph illustrating output characteristics of the simplified circuit of FIG. 4, in accordance with one embodiment.

Referring still to the equivalent circuit in the functional block diagram 600 of FIG. 6 the upper circuit section includes the combination of the diode Dboot 1104 (Dbs), which represents the equivalent of diode Dboot 1104 in FIG. 3, and the impedance Zbs 1204, which represents the equivalent of and Rboot_load_line 1116 of FIG. 3. In addition, in FIG. 5, the first DC voltage source 1202, which is labeled as "primary Vdd 1202," corresponds to the Vdd into VDRV of FIG. 3 (i.e., the supply voltage). The lower circuit section in FIG. 5 represents the rectifier circuit 129 of FIG. 3 via diode Drectifier 1210, and Ztransformer 1208 represents the impedance of pulse transformer 126. The second DC voltage source 1206, represents the DC voltage provided by internal pulse transformer 126 (FIG. 3), which is then rectified by rectifier circuit 129.

The output from the series combination of second DC voltage source 1206, Ztransformer 1208, and diode Drectifier 1210 is what is OR'd with the series combination of first DC voltage source (primary Vdd 1202), Zbs 1204 and diode Dboot 1104. The resultant OR'd output (connecting the cathode terminal of diode Dboot 1104 to the cathode terminal of diode Drectifier 1210) is what is provided as VSEC 1212 (gate drive rail) into capacitor Cboot 1102 and lower switch 1214. Thus, the value that appears after the OR function, at VSEC 1212, is the higher of the two inputs, less the amount of voltage drop across the respective diode. In certain embodiments, the output characteristics of the upper and lower circuits are designed so that there is a droop, such that only one of them would effectively work for a given working condition, depending on the required load. In addition, if the first modified driver 400 of FIG. 3 is only to be used on lower gate charge applications, and the boost components including diode Dboot 1104 and capacitor Cboot 1102 are never connected, then the logical OR'ing of FIG. 5 effectively only has the lower (transformer path) input, so only the internal components of the first modified driver 400 are used to provide gate charge, as will be understood.

The operation of the equivalent circuit of FIG. 5 is shown in FIG. 6, which is a graph illustrating output characteristics of the simplified circuit of FIG. 5, in accordance with one embodiment. FIG. 6 illustrates the value of VSEC (V) as a function of current (I). FIG. 6 shows three signals that can appear as the OR'd output at VSEC, depending on current being provided (which correlates with gate charge being provided, as is understood). The signal labeled "bootstrap 1302 (secondary bias)" and showing the pattern of long and short dashes, corresponds to the signal on cathode terminal of diode Dboot 1104, which effectively is the output of signal on the bootstrap path (the path of primary Vdd, Zbs 1204, and diode Dboot 1104) is larger. The signal labeled "transformer 1304 (primary bias 1304)" and corresponding to the pattern of short dashes, corresponds to the level of signal on cathode terminal of diode Drectifier 1210, which effectively is the output of the signal on the transformer (internal) path (the path of second DC voltage source 1206, Ztransformer 1208 and diode Drectifier 1210). The signal labeled "combined 1306 (combined bias 1306)" and corresponding to the pattern of dots, shows the level of VSEC that results from the OR'ing of the voltage levels appearing on the cathode terminals of the two diodes Dboot 1104 and diode Drectifier 1210. The combined bias 1306 thus is the logically OR'd combination of the transformer bias (primary bias 1304) and the bootstrap bias (secondary bias 1302).

As FIG. 6 illustrates, at lower levels of current I (lower levels of gate charge being provided to MOSFET Q1 in FIG. 4), which is labeled in FIG. 6 as the lower gate charge region, the Power-Thru transformer provides gate charge 1310 and the combined signal (combined bias 1306) matches the signal of the transformer 1304, which is the larger of those two signals at those levels of current I. At higher levels of current I, labeled in FIG. 6 as "higher gate charge region, boost bootstrap arrangement for higher gate charge 1312," the combined signal matches the signal of the bootstrap 1302 side (which is the larger of the two signals at those levels of current I). FIG. 6 thus depicts how power sharing/current sharing between the internal (transformer) circuit and the external (boost components) works, in certain embodiments, depending on the load and the corresponding gate charge needs.

FIG. 6 also shows that the voltage level of the VSEC rail (V) does vary with effective loading of the gate of FET (e.g., switch) being driven. At higher levels of VSEC and low gate charge, the gate charge provided by the pulse transformer 126 path dominates the combined output. As VSEC level falls, more charge is available to be delivered to the secondary side 104, while the charge consumed by the FET gate decreases with falling VSEC level. Therefore, in certain embodiments, the VSEC rail will droop as far as needed until the charge delivered matches the charge consumed, but as FIG. 6 shows, at an operating/changeover point 1308, the extra gate charge available from the boost components (bootstrap 1302 in FIG. 6) is what dominates the gate charge delivered.

Referring to FIGS. 4, 5, and 6, when the lower switch 121 is closed (the equivalent of MOSFET Q1 being turned on/conducting), effectively, the SOURCE pin of U2 in FIG. 4 is pulled to PGND. This means that the lower terminal of the capacitor Cboot 1102 is, from a circuit standpoint, grounded. If the lower terminal of the capacitor Cboot 1102 is grounded (i.e., at 0 voltage), that forward biases the diode Dboot 1104 with respect to VISO (in FIG. 5). Because VISO is at a nonzero voltage such as 12V or 15V, that allows the capacitor Cboot 1102 to be replenished. From that point, capacitor Cboot 1102 acts as a reservoir and floats with the drain of lower switch 1214 (MOSFET Q1). Each time the lower switch 1214 is closed, the capacitor Cboot 1102 is fed by diode Dboot 1104. When the lower switch 1214 is open, capacitor Cboot 1102 is no longer connected to ground and is floating at its stored voltage while, discharging some of its stored voltage to provide boost to drive Q1. The diode Dboot 1104 goes into a reverse bias state and prevents capacitor Cboot 1102 from discharging into the primary Vdd (VDRV). The lower switch 1214 (Q1 in FIG. 5) can close again (be turned on again) and recharge Cboot.

The internal power supply of the modified driver of FIG. 4 (i.e., the power provided via pulse transformer 126 as discussed above) is configured to establish a baseline of power into the floating capacitor Cboot 1102 even without waiting for the above-described bootstrap arrangement to kick in when lower switch 1214 is closed. This happens at startup, as discussed previously above in connection with the driver 100 of FIG. 1. Recall from the discussion above in connection with FIG. 1, once VDRV is applied and exceeds the predetermined threshold, the internal LDOs (i.e., bandgap LDO circuit 110 on primary side 102 and bias LDO's circuit 131 on secondary side 104) and regulators are enabled, and once EN goes high, then the primary side 102 enables power transfer to the secondary side 104, to charge the secondary side isolated bias rails, including VSECP and VSECN. This all takes place at the lower levels of gate charge in FIG. 6. This enables the capacitor Cboot 1102 to get charged to a nominal level. This establishes a function of the entire application circuit (e.g., circuit of FIG. 5) without going through initialization of the application circuit.

Subsequently, as the first modified driver 400 operates in its application circuit 1250, driving the MOSFET Q1, a majority of the power and gate charge (in higher gate drive circumstances) is provided via the boost components which include capacitor Cboot 1102, diode Dboot 1104, and load line resistor R_load_line 1116. Eventually, based on power and gate charge needs, both sources of gate charge (e.g., the boost components and the internal source of gate charge via the pulse transformer 126) can handle the gate charge needs in a dynamic way, in accordance with the example shown in the graph of FIG. 6. For example, in applications where gate charge needs may vary dynamically (e.g., during initialization and startup and then ongoing operation), for low gate charge needs, the internal gate charge source provides the gate charge via the power-through arrangement and pulse transformer 126; for higher gate charge needs, the gate charge from the boost components can combine with the gate charge from internal components, to meet the needs of the application, as shown in FIG. 6. Note that, in at least some embodiments, a given application does not have significantly varying gate charge needs; that is, different gate charge requirements, in certain embodiments, tends to occur in different applications, not within the same application. FIG. 6 illustrates that, beyond the operating/changeover point 1308, an exemplary PowerThru implementation does not provide sufficient charge (line 1304 falls below line 1306). FIG. 6 is not intended to depict situations such as startup or initialization.

Figure 7:
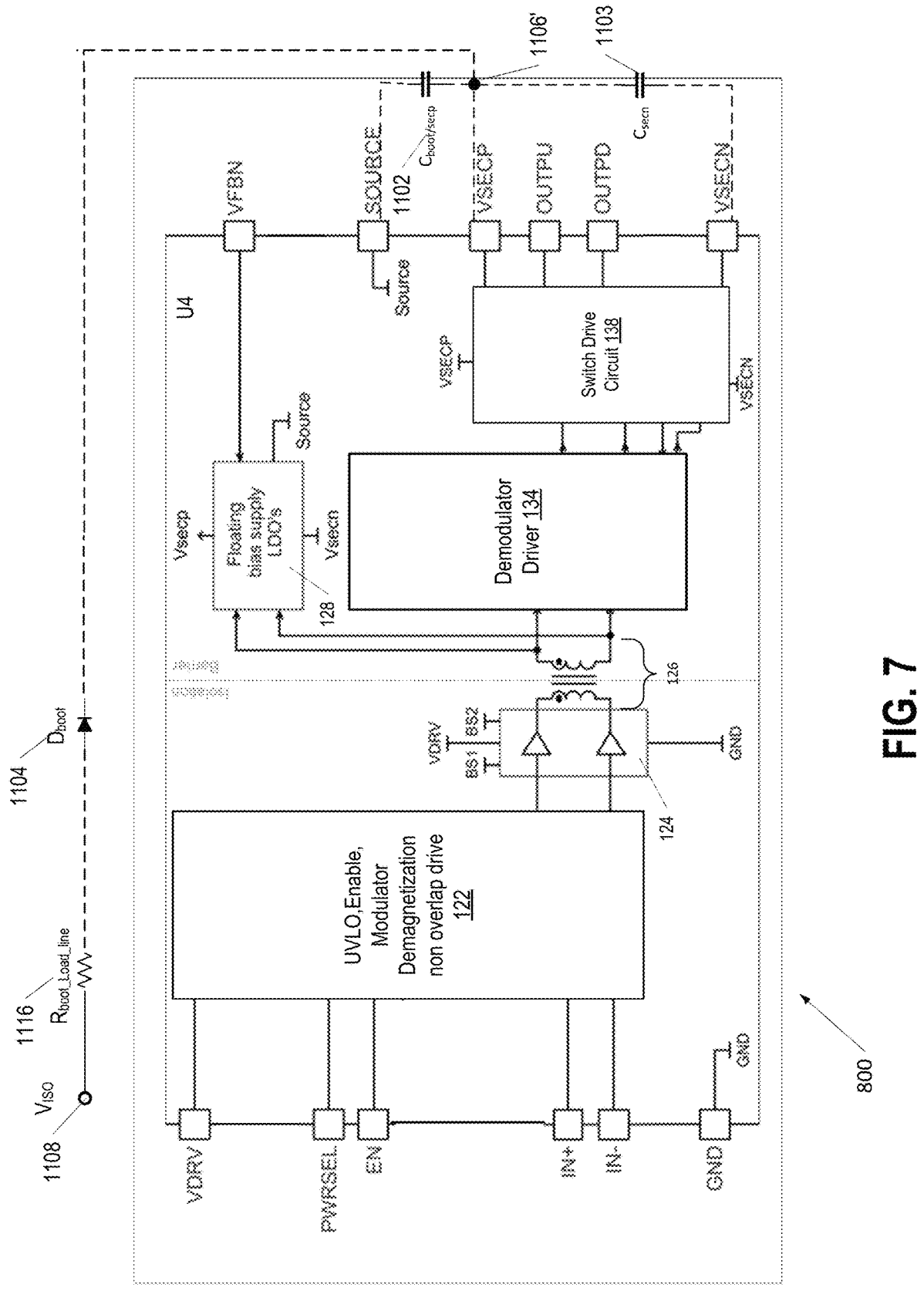
FIG. 7 is a functional block diagram of a second modified version of the isolated gate drive circuit of FIG. 1, showing a second embodiment of a power through booster modification in accordance with one embodiment.

FIG. 7 is a functional block diagram of a second modified version of the isolated gate drive circuit of FIG. 1, showing a second embodiment of a power through booster modification in accordance with one embodiment (referred to herein as "second modified gate driver 800"). The internal circuits and subcircuits of the second modified driver 800 that have the same name and reference number as the same circuit described above in connection with FIG. 1 (e.g., UVLO circuit 108, bandgap LDO circuit 110, etc.), for both the primary side 102 and secondary side 104, are identical to what was described in connection with FIG. 1 and are not repeated here.

Referring to FIG. 7, the second modified driver 800 shows a different tap point 1106', at the junction between capacitor Cboot 1102 (which functions similarly to CSECP of FIG. 4 as discussed above) and Csecn 1103 (which functions similarly to CSECN of FIG. 4 as discussed above). The operation of the second modified driver 800 is similar to the operation of the first modified driver 400.

For purposes of illustrating the present embodiments, the disclosed embodiments are described as embodied in a specific configuration and using special logical arrangements, but one skilled in the art will appreciate that the device is not limited to the specific configuration but rather only by the claims included with this specification. In addition, it is expected that during the life of a patent maturing from this application, many relevant technologies will be developed, and the scopes of the corresponding terms are intended to include all such new technologies a priori.

In this disclosure, the terms "comprises," "comprising", "includes", "including", "having" and their conjugates at least mean "including but not limited to". As used herein, the singular form "a," "an" and "the" includes plural references unless the context clearly dictates otherwise. Various elements, which are described in the context of a single embodiment, may also be provided separately or in any suitable subcombination. It will be further understood that various changes in the details, materials, and arrangements of the parts that have been described and illustrated herein may be made by those skilled in the art without departing from the scope of the following claims.

Throughout the present disclosure, absent a clear indication to the contrary from the context, it should be understood individual elements as described may be singular or plural in number. For example, the terms "circuit" and "circuitry" and "module" may include either a single component or a plurality of components, which are either active and/or passive and are connected or otherwise coupled together to provide the described function. Within the drawings, like or related elements have like or related alpha, numeric or alphanumeric designators. Further, while the disclosed embodiments have been discussed in the context of implementations using discrete components, including some components that include one or more integrated circuit chips), the functions of any component or circuit may alternatively be implemented using one or more appropriately programmed processors, depending upon the signal frequencies or data rates to be processed and/or the functions being accomplished. Similarly, in addition, in the Figures of this application, the total number of elements or components shown is not intended to be limiting; those skilled in the art can recognize that the number of a particular component or type of element can, in some instances, be selected to accommodate the particular user needs.

In describing and illustrating the embodiments herein, in the text and in the figures, specific terminology (e.g., language, phrases, product brands names, etc.) may be used for the sake of clarity. These names are provided by way of example only and are not limiting. The embodiments described herein are not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, elements, circuits, modules, tables, software modules, systems, etc. Such terminology used herein, however, is for the purpose of description and not limitation.

Although the embodiments included herein have been described and pictured in an advantageous form with a certain degree of particularity, it is understood that the present disclosure has been made only by way of example, and that numerous changes in the details of construction and combination and arrangement of parts may be made without departing from the spirit and scope of the described embodiments. Having described and illustrated at least some the principles of the technology with reference to specific implementations, it will be recognized that the technology and embodiments described herein can be implemented in many other, different, forms, and in many different environments. The technology and embodiments disclosed herein can be used in combination with other technologies. In addition, all publications and references cited herein are expressly incorporated herein by reference in their entirety. Individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

What is claimed is:

1. A drive circuit for controlling an operation of a semiconductor switch, the drive circuit comprising:
a transformer having a primary winding and a secondary winding;
a primary side circuit in operable communication with the primary winding, the primary side circuit operably coupled to a primary side supply voltage and to an input signal, wherein the primary side circuit is configured to operably couple a first signal to the primary winding of the transformer; and
a secondary side circuit in operable communication with the secondary winding and the semiconductor switch; and
wherein the secondary side circuit is configured to provide, in response to the first signal coupled from the primary winding to the secondary winding, a second signal to control the semiconductor switch, wherein the second signal comprises at least one of a primary bias and a secondary bias, wherein:
for a first range of gate charge levels required to bias the semiconductor switch on, the secondary side circuit provides the primary bias; and
for a second range of gate charge levels required to bias the semiconductor switch on, where the second range of gate charge levels includes gate charge levels that are greater than those in the first range of gate charge levels, the secondary side circuit is configured to be controllable by a secondary bias circuit that is operably and removably coupled to the drive circuit, wherein the secondary bias circuit comprises a storage capacitor that is configured to accumulate voltage when the secondary side circuit is providing the primary bias.

2. The drive circuit of claim 1, wherein the secondary side circuit comprises a rectifier in operable communication with the secondary winding and a bias low dropout circuit in operable communication with the rectifier, wherein the secondary side circuit further comprises a boost tap point disposed in between the rectifier and the bias low dropout circuit, wherein the storage capacitor of the secondary bias circuit is operably coupled at a first side to the boost tap point and at a second side to an isolated output return for the secondary side circuit.

3. The drive circuit of claim 2, wherein the secondary bias circuit further comprises a diode having a cathode terminal operably coupled to the boost tap point and an anode terminal of the diode operably coupled to an isolated supply voltage, wherein the isolated supply voltage is electrically isolated from the primary side supply voltage.

4. The drive circuit of claim 3, wherein, when the semiconductor switch is turned on, the semiconductor switch is supplied with gate charge via a voltage stored on the storage capacitor, and when the semiconductor switch is turned off, the diode of the secondary side circuit is configured to replenish the voltage stored on the storage capacitor.

5. The drive circuit of claim 1 wherein the secondary side circuit is configured to provide the second signal when the semiconductor switch is closed.

6. The drive circuit of claim 1, wherein the second signal comprises a combined bias that comprises a logically OR'd combination of the primary bias and the secondary bias.

7. The drive circuit of claim 1 wherein, when the semiconductor switch is turned on, the semiconductor switch is supplied with gate charge via a voltage stored on the storage capacitor, and when the semiconductor switch is turned off, the secondary side circuit is configured to replenish the voltage stored on the storage capacitor.

8. An isolated high side drive circuit for controlling an operation of a semiconductor switch, the isolated high side drive circuit comprising:
a transformer having a primary winding and a secondary winding;
a primary side circuit in operable communication with the primary winding, the primary side circuit operably coupled to a primary side supply voltage and to an input signal, wherein the primary side circuit derives switch instructions for controlling the operation of the semiconductor switch based on a state of the input signal and provides the switch instructions as part of a first signal operably coupled to the primary winding of the transformer;
a secondary side circuit in operable communication with the secondary winding and the semiconductor switch, the secondary side circuit configured to provide, in response to the first signal coupled from the primary winding to the secondary winding, a second signal to control the semiconductor switch, wherein the second signal comprises at least one of a primary bias and a secondary bias, wherein:
for a first range of gate charge required by the semiconductor switch, the secondary side circuit provides the primary bias using power coupled from the primary winding to the secondary winding; and
for a second range of gate charge required by the semiconductor switch, where the second range of gate charge covers a range that is larger than the first range of gate charge, the secondary side circuit is configured to provide the secondary bias via connection to an external bootstrap circuit in operable communication with the secondary side circuit.

9. The isolated high side drive circuit of claim 8, wherein the secondary side circuit is configured to provide the second signal when the semiconductor switch is closed.

10. The isolated high side drive circuit of claim 8, wherein the second signal comprises a combined bias that comprises a logically OR'd combination of the primary bias and the secondary bias.

11. The isolated high side drive circuit of claim 8, wherein the secondary side circuit comprises a rectifier having an input operably coupled to the secondary winding of the transformer and an output operably coupled to an input of a DC voltage regulator, the DC voltage regulator configured to provide a gate drive rail for use by the semiconductor switch.

12. The isolated high side drive circuit of claim 11, wherein the external bootstrap circuit comprises a capacitor having a first plate and a second plate and a diode having a cathode terminal and an anode terminal, wherein:
the secondary side circuit comprises a source connection configured for connection to a source terminal of the semiconductor switch and a tap point connection operably coupled to the input of the DC voltage regulator;

the first plate of the capacitor is configured for operable connection to a source terminal of the semiconductor switch and the second plate is operably connected to the cathode terminal of the diode and to the tap point connection;

the anode terminal of the diode is operably connected to an isolated supply voltage that is electrically isolated from the primary side supply voltage, and the cathode terminal is operably connected to the second plate of the capacitor and the tap point connection; and wherein, when the external bootstrap circuit is connected to the secondary side circuit, a signal provided to the input of the DC voltage regulator comprises a logical OR'ing together of the output of the rectifier and of a signal at the cathode terminal of the diode.

13. The isolated high side drive circuit of claim 12, wherein, when the semiconductor switch is turned on, it is supplied with gate charge via voltage stored on the capacitor of the external bootstrap circuit, and when the semiconductor switch is turned off, the secondary side circuit is configured to replenish the voltage across the capacitor of the external bootstrap circuit.

14. A method of providing a drive circuit configured for controlling operation of a semiconductor switch, comprising:

operably coupling a primary side circuit to a primary winding of a transformer, the primary side circuit operably coupled to a primary side supply voltage and to an input signal, wherein the primary side circuit is configured to operably couple a first signal to the primary winding of the transformer;

operably coupling a secondary side circuit to a secondary winding of the transformer, wherein the secondary side circuit is in operable communication with a semiconductor switch and wherein the secondary side circuit is configured to provide, in response to the first signal being coupled from the primary winding to the secondary winding, a second signal to control the semiconductor switch, wherein the second signal comprises at least one of a primary bias and a secondary bias, wherein:

for a first range of gate charge levels required to bias the semiconductor switch on, the secondary side circuit is configured to provides the primary bias; and for a second range of gate charge levels required to bias the semiconductor switch on, where the second range of gate charge levels includes gate charge levels that are greater than those in the first range of gate charge levels, the secondary side circuit is configured to be controllable by a secondary bias circuit that is operably and removably coupled to the drive circuit, wherein the secondary bias circuit comprises a storage capacitor that is configured to accumulate voltage when the secondary side circuit is providing the primary bias.

15. The method of claim 14, further comprising:

configuring the secondary side circuit to further comprise a rectifier in operable communication with the secondary winding and a bias low dropout circuit in operable communication with the rectifier; and disposing a boost tap point disposed in between the rectifier and the bias low dropout circuit, wherein the storage capacitor of the secondary bias circuit is operably coupled at a first side to the boost tap point and at a second side to an isolated output return for the secondary side circuit.

16. The method of claim 15, further comprising operably coupling a cathode terminal of a diode to the boost tap point and operably coupling an anode terminal of the diode to an isolated supply voltage, wherein the isolated supply voltage is electrically isolated from the primary side supply voltage.

17. The method of claim 16, further comprising:

supplying the semiconductor switch with gate charge via a voltage stored on the storage capacitor when the semiconductor switch is turned on; and replenishing the voltage stored on the storage capacitor, via the diode, when the semiconductor switch is turned off.

18. The method of claim 14, further comprising providing the second signal when the semiconductor switch is closed.

19. The method of claim 14, wherein the second signal comprises a combined bias that comprises a logically OR'd combination of the primary bias and the secondary bias.

20. The method of claim 15, further comprising:

supplying the semiconductor switch with gate charge via a voltage stored on the storage capacitor when the semiconductor switch is turned on; and replenishing the voltage stored on the storage capacitor, via the secondary side circuit, when the semiconductor switch is turned off.

* * * * *